(12) United States Patent
Vora

(10) Patent No.: US 9,082,869 B2
(45) Date of Patent: Jul. 14, 2015

(54) APPARATUS AND METHODS FOR HIGH-DENSITY CHIP CONNECTIVITY

(75) Inventor: Madhukar B. Vora, Los Gatos, CA (US)

(73) Assignee: TERAPEDE SYSTEMS, INC., Campbell, CA (US)

( * ) Notice: Subject to any disclaimer, the term of this patent is extended or adjusted under 35 U.S.C. 154(b) by 823 days.

(21) Appl. No.: 13/232,753

(22) Filed: Sep. 14, 2011

(65) Prior Publication Data

US 2012/0061856 A1    Mar. 15, 2012

Related U.S. Application Data

(60) Provisional application No. 61/382,870, filed on Sep. 14, 2010.

(51) Int. Cl.
| | |
|---|---|
| *H01L 23/48* | (2006.01) |
| *H01L 23/00* | (2006.01) |
| *H01L 25/065* | (2006.01) |
| *H01L 25/18* | (2006.01) |
| *H01L 29/06* | (2006.01) |

(52) U.S. Cl.
CPC ............ *H01L 24/81* (2013.01); *H01L 25/0655* (2013.01); *H01L 24/16* (2013.01); *H01L 24/94* (2013.01); *H01L 25/0652* (2013.01); *H01L 25/18* (2013.01); *H01L 29/0657* (2013.01); *H01L 2224/10165* (2013.01); *H01L 2224/17515* (2013.01); *H01L 2224/81001* (2013.01); *H01L 2224/81002* (2013.01); *H01L 2224/81005* (2013.01); *H01L 2224/81139* (2013.01); *H01L 2224/81141* (2013.01); *H01L 2224/81193* (2013.01); *H01L 2224/81203* (2013.01); *H01L 2225/06513* (2013.01); *H01L 2225/06593* (2013.01); *H01L 2924/014* (2013.01); *H01L 2924/01023* (2013.01); *H01L 2924/01033* (2013.01); *H01L 2924/01079* (2013.01); *H01L 2924/10253* (2013.01); *H01L 2924/1461* (2013.01)

(58) Field of Classification Search
CPC ............ H01L 21/563; H01L 21/67356; H01L 23/3114; H01L 23/538; H01L 2924/18161; H01L 2924/18162
See application file for complete search history.

(56) References Cited

U.S. PATENT DOCUMENTS

2011/0278718 A1* 11/2011 Thacker et al. ............... 257/737

* cited by examiner

*Primary Examiner* — Kyoung Lee
(74) *Attorney, Agent, or Firm* — David R. Stevens; Stevens Law Group

(57) ABSTRACT

An electronic circuit and method may include a first chip including first electronics and a first connector including multiple self-alignment features and conductive pads. A second chip may include second electronics and a second connector including multiple self-alignment features and conductive pads. The first chip and second chip may be indirectly horizontally aligned with one another and in electrical communication with one another via the first and second connectors.

16 Claims, 7 Drawing Sheets

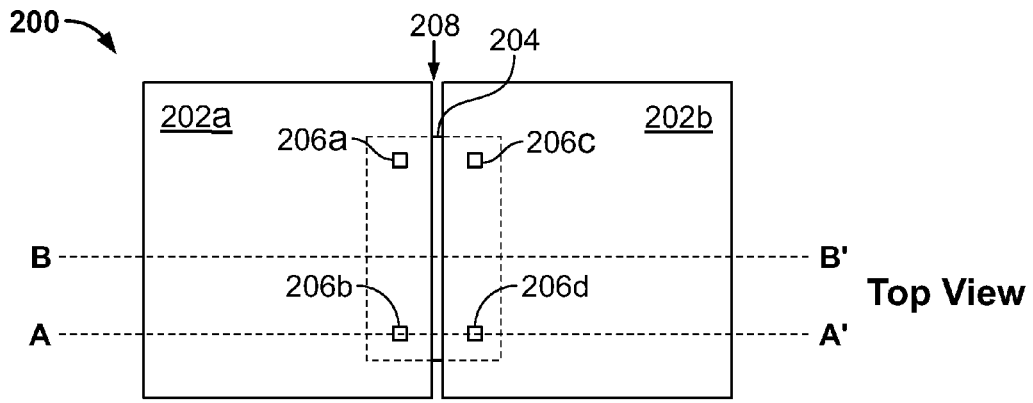
FIG. 2A
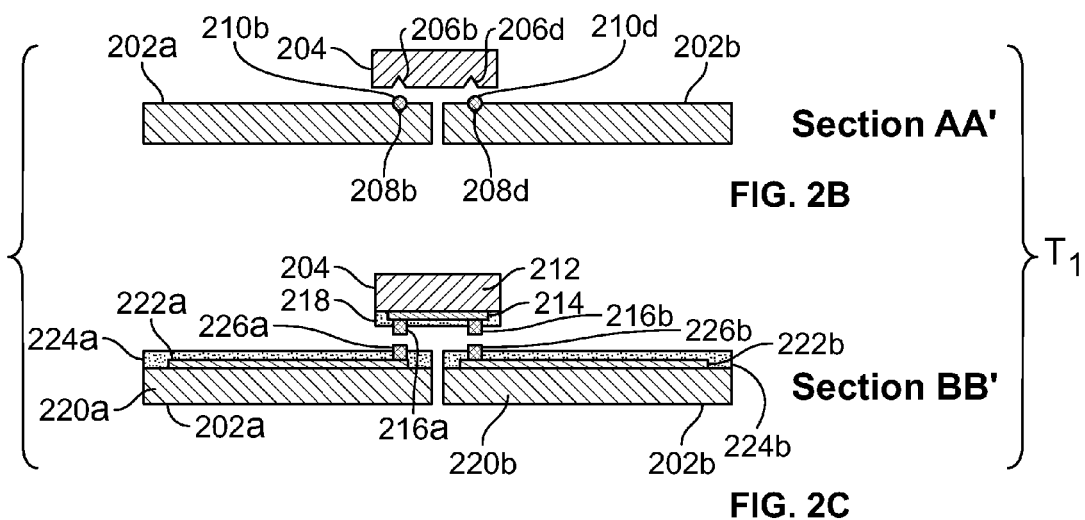
FIG. 2B
FIG. 2C
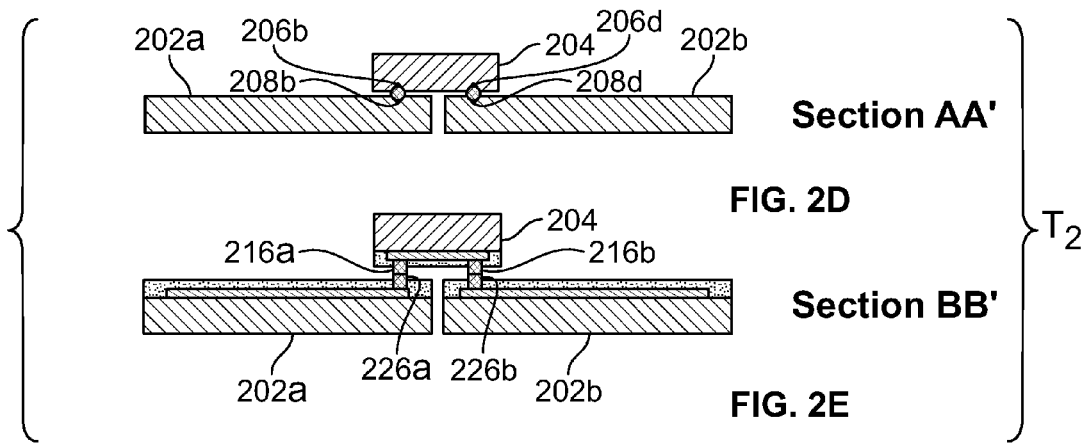
FIG. 2D
FIG. 2E

APPARATUS AND METHODS FOR HIGH-DENSITY CHIP CONNECTIVITY

RELATED APPLICATIONS

This application claims the benefit of U.S. Provisional Application No. 61/382,870 filed Sep. 14, 2010, the entire contents of which are incorporated herein by reference.

BACKGROUND

Current techniques for connecting chips to one another include using a PC board and connecting the chips via data trace lines. For example, two VLSI chips may be connected via trace lines extending along the PC board between the two chips. One problem with such a configuration includes large capacitance along the trace lines, which lowers bandwidth and increases size of the devices. Heat is also generated with larger capacitance. In addition, I/O capacitance of devices of the chips themselves is relatively high, which further lowers bandwidth and increases heat. Electrical reliability at higher rates is also reduced because digital square waves become rounded. As understood the in art, solder is typically used to connect the chips to the PC board trace lines. Solder inherently increases capacitance and has the ability to have reliability issues due to "cold" solder joints and other well known problem.

System on a chip (SOC) may use flip-chip connection technology between a PC board and VLSI chips. There are various forms of flip-chip technologies that may be utilized. While flip-chip technology offers some level of benefits for improved performance and ease of manufacturing, the trace lines that extend along a PC board result in the same or similar high capacitance, limited bandwidth, and thermal problems as traditional wire bond.

A single chip SOC with major pre-designed and proven SOC building blocks placed and wired in a single chip are also available. While each of the components, including a micro-processor, digital signal processor (DSP), memory, and input/output (I/O) chips, are placed on a single SOC chip, each of the components are still physically spaced apart from one another. As a result, the trace line interconnects are long enough to provide enough capacitance that materially affect bandwidth and cause heat generation. Still yet, because of the spacing between the chips, valuable physical real estate is lost that could otherwise be used for certain functionality and performance for the system. And, because the size of the chip is larger, system level designs are negatively affected, as understood in the art. In addition, because of the larger chip size, manufacturing yields are reduced, which can be very costly due to the cost of such a system on a chip.

SUMMARY

The principles of the present invention provide for self-alignment structures, such as V-grooves and balls, to be formed on chips and devices, such as bridges and wafers, that provide for communication paths between the chips. Chips with connectors that include the self-alignment structures and conductive pads on the side of the circuits may be horizontally aligned and electrically connected to one another using a bridge or wafer with corresponding connectors. The bridge or wafer may physically interface with a smaller surface area of the chip(s) than the entire surface area of either or both of the chips. As an example, the alignment structures can align an array of conductive pads having a pitch of 0.5 microns, compared to a pitch of 100 microns available with today's ball grid array (BGA) or through silicon via technology. As a result, circuits in the chips can communicate via the conductive pads with the same speed or clock frequency as if in a single chip. For example, clock rates between chips can be increased from 100 MHz to 4 GHz or higher due to short distances, and hence low capacitance, of the communication paths between conductive pads on different chips. Because high-density arrays of conductive pads can interconnect chips, chips can be made smaller, thereby reducing cost of chips by order(s) of magnitude.

One embodiment of an electronic circuit may include a first chip including first electronics and a first connector including multiple self-alignment features and conductive pads. The embodiment may also include a second chip including second electronics and a second connector including multiple self-alignment features and conductive pads. The first chip and second chip may be indirectly horizontally aligned with one another and in electrical communication with one another via the first and second connectors.

One method of manufacturing an electronic circuit according to an embodiment of the present invention may include providing (i) a first chip including first electronics and a first connector including multiple self-alignment features and conductive pads, and (ii) a second chip including second electronics and a second connector including multiple self-alignment features and conductive pads. The first chip and second chip may be self-aligned via the respective self-alignment features, with the first and second chips being indirectly horizontally aligned with one another. The first and second chips may be electrically connected via the first and second connectors.

BRIEF DESCRIPTION OF THE DRAWINGS

A more complete understanding of the method and apparatus of the present invention may be obtained by reference to the following Detailed Description when taken in conjunction with the accompanying Drawings wherein:

FIGS. 2A-2E are illustrations of an illustrative pair of chips horizontally aligned and in communication with one another via a bridge connector and cross-sections thereof at different points in time during a manufacturing process;

DETAILED DESCRIPTION OF THE DRAWINGS

Figure 1:
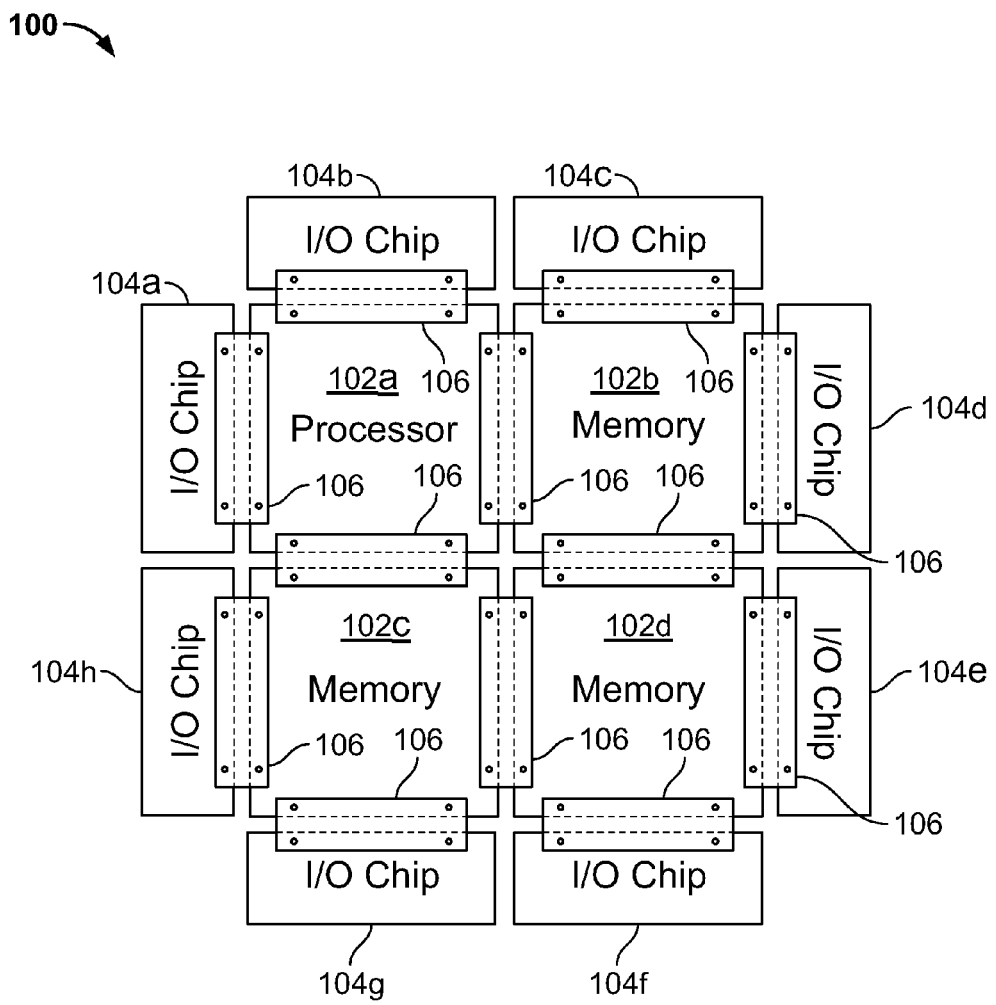
FIG. 1 is an illustration of an illustrative circuit including multiple chips that are configured in a coplanar manner and are in communication with one another using bridge connectors.
Figure 3A:
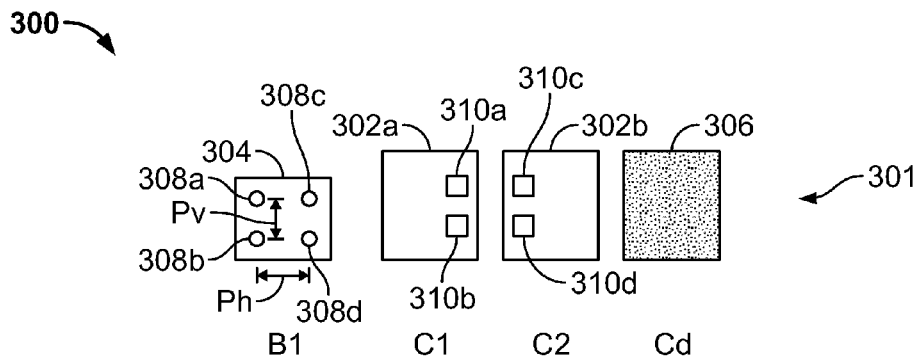
FIGS. 3A-3G are illustrations of an illustrative process for indirectly self-aligning chips horizontally.
Figure 3B:
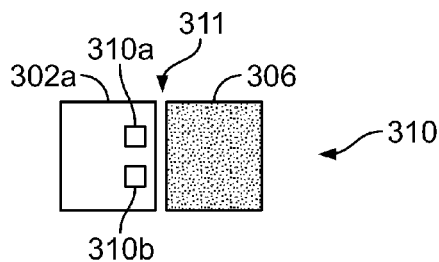
Figure 3C:
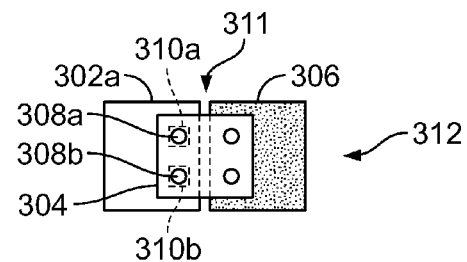
Figure 3D:
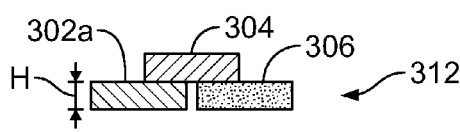
Figure 3E:
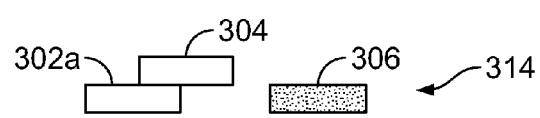
Figure 3F:
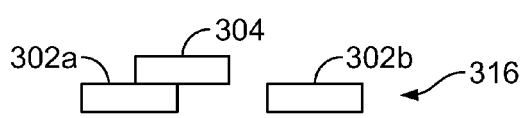
Figure 3G:
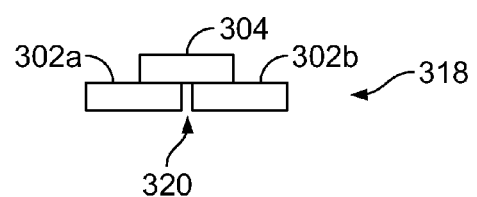

FIG. 1 is an illustration of an illustrative electronic circuit 100 including chips 102a-102d (collectively 102), such as very large-scale integrated (VLSI) circuit chips, and input/output (I/O) chips 104a-104h (collectively 104). The chips 102 shown include a processor chip 102a and three memory chips 102b-102d. It should be understood that the electronic circuit 100 is illustrative and that alternative configurations may be utilized. For example, two processors and two memories, three processors and one memory, four processors, four memories, or other configuration may be utilized. It should further be understood that chips other than processors and memories, such as image sensors, may be utilized to form the electronic circuit 100. The I/O chips 104 are utilized to communicate electrical signals external to and from the electronic circuit 100. As shown, the chips 102 and I/O chips 104 are horizontally aligned or coplanar. By being horizontally aligned, the vertical profile is thinner than three-dimensionally configured chips, as described in U.S. Pat. No. 7,745,301, which is incorporated herein by reference in its entirety.

Each of the chips 102 may be electrically connected with one another via bridge chips 106, where each of the chips 102 include connectors (not shown) with conductive pads and self-alignment features, such as the connectors described in U.S. Pat. No. 7,745,301 and as further described herein. In one embodiment, the bridge chips 106 include a pair of connectors (not shown) with conductive pads and self-alignment features that are configured to connect with the connectors of the chips 102. The bridge chips 106 may be formed of semiconductor chips, such as silicon chips, with conductive trace lines or traces that electrically connect the pair of connectors. The pair of connectors on the bridge chips 106 may be identical, mirror images of one another, or different. In addition, each of the chips 102 are electrically connected with I/O chips 104 via bridge chips 106. As shown, the bridge chips 106 reside on a portion of the respective chips 102 and I/O chips 104. For example, one connector on a bridge chip may connect to chip 102a and the other connector on the same bridge chip may connect to chip 102c, where both of the connectors on the bridge chip self-align, as further described herein, with the connectors on the chips 102a and 102c. The chips 102, I/O chips 104, and bridge chips 106 may be formed using the same or different semiconductor manufacturing processes, as understood in the art.

The length and width of the connector, dimensions of the conductive pads, and pitch between conductive pads may establish the number of conductive pads or pins on each of the connectors. More specifically, the number of pins along a connector is equal to the length divided by the pitch between the conductive pads. As an example, a 90 nm node semiconductor chip manufacturing process that has a metal layer pitch of 0.5 microns has 20,000 pins per cm.

FIGS. 2A-2E are illustrations of a tiled configuration 200 of an illustrative pair of chips 202a and 202b (collectively 202) that are horizontally aligned and in communication with one another via a bridge chip 204. Cross-sections of the tiled configuration 200 at different points in time during a manufacturing process are also shown in FIGS. 2B-2E. The bridge chip 204 is shown to include four self-alignment features 206a-206d (collectively 206) that are positioned on the silicon of the bridge chip 204, where the silicon faces silicon services of the chips 202. In one embodiment, the self-alignment features 206 may be indentations, such as V-grooves, as understood in the art. Alternatively, the self-alignment features 206 may be protrusions, such as hemispherical features of ball grid arrays, cylindrical posts, or otherwise. The self-alignment features 206 are formed using a conventional semiconductor manufacturing process. The chips 202 have corresponding self-alignment features (not shown) that are registered (i.e., vertically and horizontally aligned) with the self-alignment features 206 of the chips 202.

As shown, the bridge chip 206 extends across a portion of both of the chips 202a and 202b that are separated by a gap 208. The gap 208 is formed by an indirect alignment process that horizontally aligns the chips 202 by using the bridge chip 204 and the chips 202, as described with regard to FIGS. 2B-2E and 3A-3G.

FIGS. 2A and 2C show cross-section AA' and FIGS. 2B and 2D show cross-section BB' at times $T_1$ and $T_2$ during an illustrative indirect self-alignment process. An indirect self-alignment process is one that causes two horizontally aligned chips to be self-aligned with a vertically aligned structure, such as bridge chip 204 or wafer (see FIGS. 4A and 4B). At time $T_1$, FIG. 2A shows the bridge chip 204 being positioned above the chips 202 and have self-alignment features 206b and 206d be positioned over alignment features 208b and 208d on the chips 202a and 202b. The self-alignment features 206b, 206d, 208b, and 208d are V-grooves. It should be understood that alternative alignment features may be utilized, as described in U.S. Pat. No. 7,745,301. Positioned within the alignment features 208b and 208d are balls 210b and 210d, which are used to self-align the bridge chip 204 with the chips 202, and indirectly self-align the chips 202a and 202b with one another.

FIG. 2C shows the bridge chip 204 including a substrate 212 on which a semiconductor layer 214 is disposed or deposited. Conductive pads 216a and 216b are deposited on semiconductor layer 214 and protrude through an insulator layer 218. Trace lines (not shown) extend across the semiconductor layer 214 between the conductive pads 216a and 216b, thereby providing electrical communication between connectors formed by the conductive pads 216a and 216b, respectively. It should be understood that the conductive pads 216a and 216b are actually part of a set of many conductive pads that extend along the bridge chip 204 between the self-alignment features 206a, 206b and 206c, 206d, respectively. It should further be understood that the semiconductor layer 214 may include multiple metal layers (not shown) that extend therethrough, and the conductive pads 216a and 216b may extend into the semiconductor layer 214 to connect to the different metal layers, as further described herein in reference to FIG. 7.

Continuing with FIG. 2C, the chips 202a and 202b include base substrates 220a and 220b, respectively (collectively 220). Semiconductor layers 222a and 222b (collectively 222) are deposited on respective base substrates 220. The semiconductor layers 222 include VLSI circuitry (not shown). Insulator layers 224a and 224b (collectively 224) are deposited on the semiconductor layers 222. Extending through the insulator layers 224 from the semiconductor layers 222 are conductive pads 226a and 226b (collectively 226). The conductive pads 226 are aligned with the conductive pads 216 of the bridge chip 204, such that when the alignment features 206 of the bridge chip 204 are registered with the alignment features 208b of the chips 202, the conductive pads 216 and 226 are aligned.

As shown in FIGS. 2B and 2C, which are at time $T_1$, the process of indirectly self-aligning the chips 202 using the bridge chip 204 includes roughly horizontally aligning the chips 202, which includes aligning the chips 202a and 202b with edges defining the gap 208 in a substantially parallel manner.

The process then continues to time $T_2$, where the bridge chip 204 is lowered onto chips 202, as shown in FIG. 2D. The self-alignment features 206 are placed onto the balls 210, which causes the alignment features 206 of the bridge chip 204 to apply force to the balls 210 to be centered within the self-alignment features 206 and self-alignment features 208. As a result of the balls 210 causing the registration of the self-alignment features 206 and 208, the chips 202 are indirectly self-aligned. To ensure that the self-alignment features 206 and 206 are substantially perfectly registered, an ultrasonic vibration may be applied to one chip at a time or both chips 202 simultaneously so that the self-alignment features 206 of the bridge chip 204 are vibrated to their lowest point relative to the balls 210. That is, by vibrating the chip(s) 202, the balls 210 become centered within the self-alignment features 206, which causes the balls 210 to enter deeper into both of the self-alignment features 206 and 208 and causes the conductive pads 216 and 226 to contact one another, as shown in FIG. 2E.

Figure 5A:
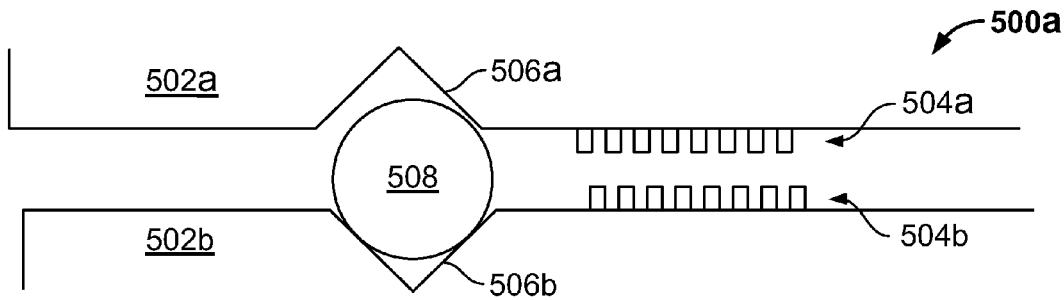
FIGS. 5A, 5B, 5C, and 5D are illustrations of a chip alignment process for connecting two chips with conductive pads.
Figure 5B:
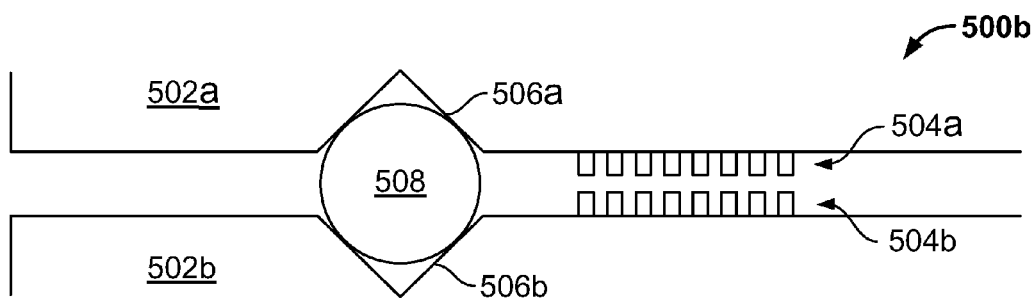
Figure 5C:
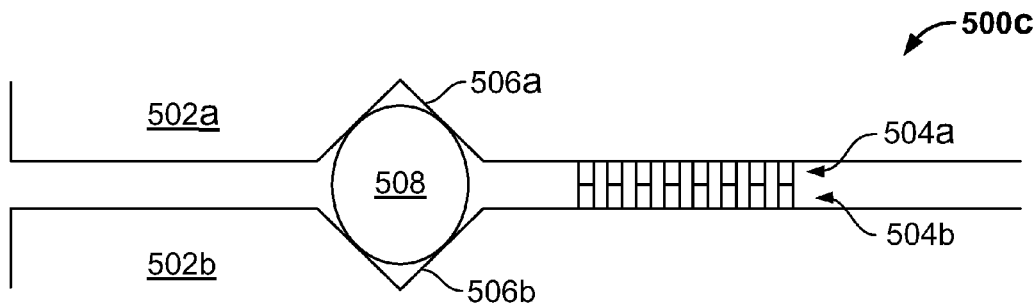
Figure 5D:
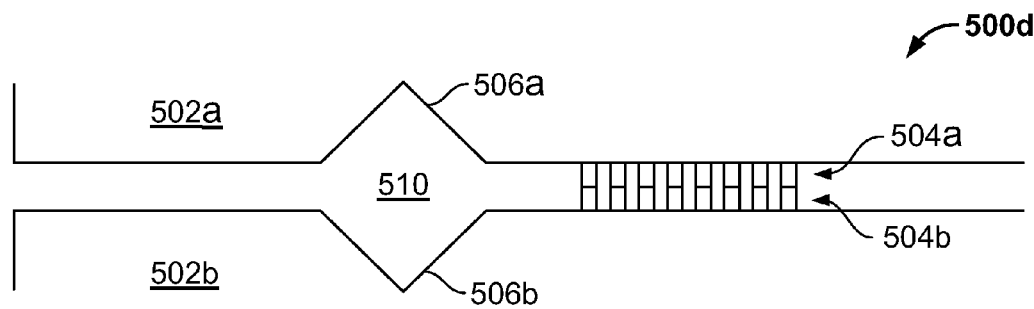

In one embodiment, the balls 210 may be formed of non-compliant material, such as solid, non-compliant metal (for the given forces, pressures, or temperatures used in chip assembly processes). In an alternative embodiment, the balls 210 may be formed of compliant material, such as plastic or a compliant metal, such as gold. In one embodiment, the plastic (i.e., compliant material) may be hollow, which allows for the balls to be compressed like a tennis ball. Such compliant balls tend to compress vertically in the gap defined by the alignment features. Although non-compliant balls may be used, alignment of conductive pads 216 and 226 has to be very accurate because there is little tolerance provided by the non-compliant balls. If using non-compliant balls, then the design of the conductive pads 216 and 226 has to be precise, where the conductive pads 216 and 226 may touch one another just prior to the alignment features 206 of the bridge chip 204 reaching maximum depth with respect to the balls 210. The use of compliant balls capable of being compressed provides for more tolerance and accuracy for aligning the conductive pads 216 and 226, as the conductive pads 216 and 226 may be designed to be slightly separated from one another when the bridge chip 204 is positioned in a self-alignment state (see, FIG. 5B).

Once in the self-alignment state, the bridge chip 204 may be pressed downward to cause the non-compliant balls 210 to deform vertically, thereby allowing the bridge chip 204 to push vertically downward until the conductive pads 216 and 226 make contact. In pushing vertically downward, the forces are to be substantially consistent across each of the alignment features to avoid tilting the bridge chip 204 with respect to one or both of the chips 202 with which the bridge chip 204 is being aligned. After the conductive pads 216 and 226 are in contact, heat (e.g., between 200 and 300 degrees Celsius) and, optionally, pressure may be applied to the chips 202 and bridge chip 204 so as to cause the conductive pads 216 and 226 to bond together. It should be noted that using compliant balls provides more ability than using non-compliant balls to maintain proper alignment and contact of the conductive pads 216 and 226 should the tiled configuration 200 have to be moved to perform the bonding process.

FIG. 3 is an illustration that shows an illustrative process 300 for indirectly self-aligning chips horizontally. The process starts at step 301 by providing two chips 302a and 302b (collectively 302) in rough horizontal alignment. The chips 302a and 302b are shown face up. A bridge chip 304 and "dummy chip" may also be provided for use during the indirect self-alignment process. The bridge chip 304 is shown face down, where the self-alignment features 308 would not normally be seen, but the self-alignment features 308 are represented for illustration purposes. The self-alignment features 308 may be surface mounted hemispherical balls, such as those used in ball grid arrays. Alternatively, the self-alignment features 308 may be indentations, such as V-grooves. In some embodiments, the dummy chip 306 does not include circuitry or self-alignment features for cost savings purposes, and is generally used to represent a second chip during self-alignment of the first chip 302a with the bridge chip 304. Self-alignment features 310a and 310b are positioned on chip 302a, and alignment features 310c and 310d are positioned on chip 302b. The alignment features 310a, 310b and 310c, 310d have a vertical pitch Pv that matches the vertical pitch of the alignment features 308a, 308b and 308c, 308d of the bridge chip 304.

At step 310, the first chip 302a and dummy chip 306 are placed side-by-side with a gap 311 between the chips 302a and 306. The gap 311 is to be small enough to have the bridge chip 304 extend across and be supported by the two chips 302a and 306, as shown at step 312. Step 312 shows both a top view and a sectional view, where the bridge chip 304 crosses the gap 311. At step 312, the bridge chip 304 is aligned with chip 302a by self-aligning the self-alignment features 208a and 308b of the bridge chip 304 with self-alignment features 310a and 310b of the chip 302a. The self-alignment process may include applying an ultrasonic vibration to the chip 302a to cause the self-alignment features 308a, 310a and 308b, 310b to align properly with one another. In the case where the self-alignment features 308a and 310a are both V-grooves, balls (not shown) are placed in the self-alignment features 310a and 310b, and the self-alignment features 308a and 308b are placed on top of the balls. As shown, the height H of chip 302a and dummy chip 306 are matched so that the bridge chip 304 is horizontal so that the conductive pads (not shown) on both the chip 302a and bridge chip 304 contact one another. The height H of the dummy chip 306 may be calibrated to account for each feature of the chip 302a, including the conductive pads. The conductive pads may be bonded with one another at step 312 with or without moving the chips 302a, 304, and 306 from an alignment station.

At step 314, the dummy chip 306 is removed from beneath the bridge chip 304. At step 316, chip 302b is placed under the bridge chip 304. At step 318, indirect alignment of the chips 302a and 302b in a horizontal direction is made by self-aligning the self-alignment features 308c, 310c and 308d, 310d of the bridge chip 304 and chip 302b. In other words, as the self-alignment of the self-alignment features is being performed, the chips 302a and 302b become aligned indirectly though the bridge chip 304. The indirect alignment process causes the chips 302a and 302b to have a gap 320 between the chips 302a and 302b. After the bridge chip 304 is self-aligned with the chip 302b, conductive pads (not shown) of the bridge chip 304 and chip 302b may be bonded with one another.

The self-alignment process described herein provides for sub-micron alignment accuracies. As a result, alignment accuracy of the indirect self-alignment process may provide for the chips being indirectly aligned to be spaced very close to one another. As a result, to accommodate the close spacing, edges that extend along the gap 320 are typically very straight. A saw is typically used to perform chip cutting. However, given the small dimensions that are produced using the principles of the present invention, plasma etching, reactive ion etching, Bosch etching, or any other process for cutting the chip edge in a highly accurate straight line (e.g., less than 1 micron of deviation accuracy) may be used. It should be understood that any process capable of providing for such highly accurate straight line edges may be utilized, including using a post cutting process to straighten an edge that is not highly accurate straight as a result of the cutting process.

Figure 4B:
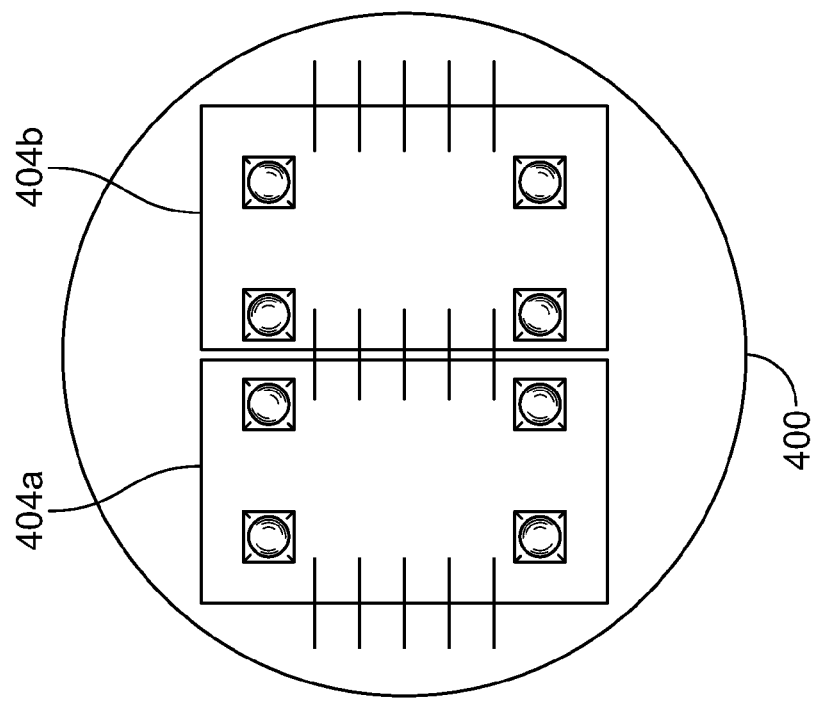
FIGS. 4A and 4B are illustrations of an illustrative wafer on which chips are indirectly horizontally aligned.
Figure 4A:
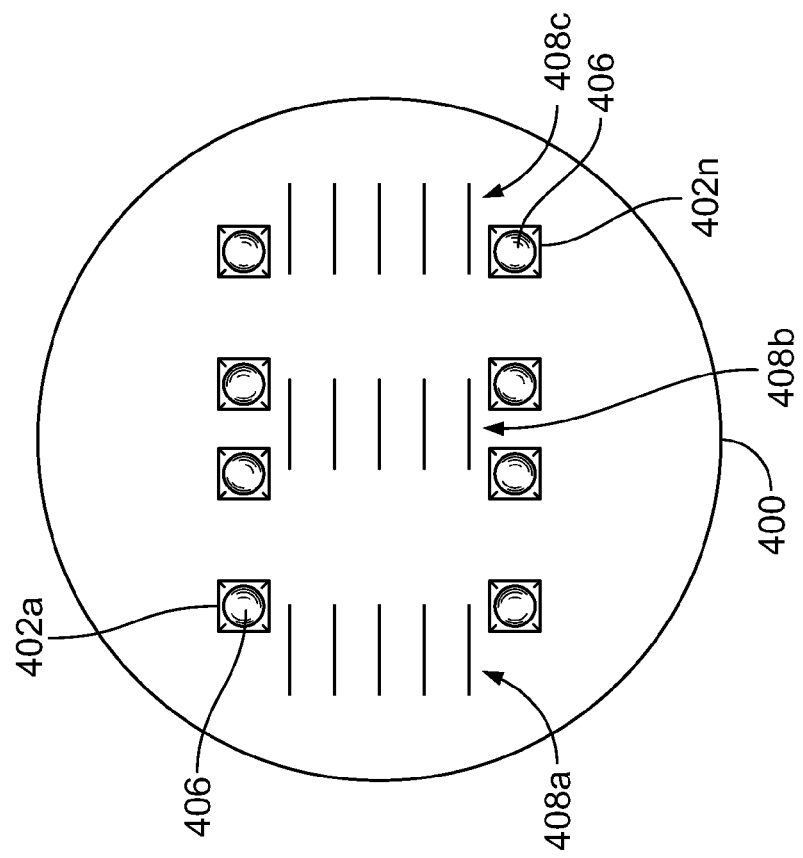

FIGS. 4A and 4B are illustrations of an illustrative wafer 400 on which chips are indirectly horizontally aligned. The wafer 400 includes self-alignment features 402a-402n (collectively 402) that are formed on the wafer 400. The self-alignment features 402 are configured to be in a position that matches self-alignment features (not shown) on the face of the chips 404a and 404b (collectively 404). The chips 404 are placed face down so the alignment features 402 and 404 face one another. The wafer 400 is configured to be very flat so that the chips 404 that are mounted thereto are able to self-align. As shown, the self-alignment features 402 are V-grooves. However, it should be understood that alternative self-alignment features may be utilized in accordance with the principles of the present invention. Sets of conductive trace lines 408a-408c (collectively 408) are deposited on the wafer 400 to bridge or extend between extending conductive pads (not shown) on the wafer that contact conductive pads (not shown) on the chips 404 when self-aligned with the wafer 400. In one embodiment, the pitch of the conductive trace lines 408 is the same as the pitch of the conductive pads on the chips 404. Although two chips 404 are shown, it should be understood that many chips and corresponding alignment features and trace lines on the wafer 400 may be provided. For example, tens or hundreds of chips may be connected to a wafer and communicate with one another as if electrical circuits were deposited on a single silicon substrate.

If the self-alignment features 402 on the wafer 400 are V-grooves and the self-alignment features 402 on the chips 404 are also V-grooves, then balls 406 are placed in the self-alignment features 402. The chips 404 are then placed facedown on top of the wafer 400, such that the self-alignment features of the chips 404 are on top of the balls (i.e., in vertical alignment with the self-alignment features 402). Once the self-alignment features of the chips 404 are aligned with the self-alignment features 402 of the wafer 400, the alignment features are considered to be registered with one another. And, as the chips 404 are self-aligned with the wafer 400, the chips 404 are indirectly aligned with one another via the wafer 400.

The indirect self-alignment process using the wafer 400 may enable individual or simultaneous self-alignment of each of the chips 404 with the wafer 400. That is, after one or more chips are placed on the wafer, an ultrasonic vibration may be applied to the wafer to vibrate the one or more chips so that self-alignment of the chips 404 relative to the wafer 400 occurs via coupling of alignment features 402, optionally through use of the balls, and, consequently, indirect self-alignment between adjacent or non-adjacent chips 400 occurs. It should be understood that an alternative to using ultrasonic vibrations to perform self-alignment may be utilized in accordance with the principles of the present invention. It should also be understood that other self-alignment structures may be utilized, as further described herein.

The conductive pads on the chips and bridge or wafer may have lengths and widths as small as trace lines on the chips, and conductive trace lines that extend along bridge chips or wafers may be short (e.g., 20 microns) so that communications between the chips may operate as fast as on-chip communications. The height of the conductive pads extending perpendicular from the semiconductor may be short (e.g., 5 microns), so that minimal capacitance (e.g., 5-10 fF/conductive pad) is created by the conductive pads. As a result of have small pitch between conductive pads, high density of conductive pads (e.g., $8e^7/cm^2$) may be achieved. The on-chip communication speeds between the chips may occur due to capacitance of the conductive pads and conductive trace lines being low, as described in U.S. Pat. No. 7,745,301.

FIGS. 5A, 5B, 5C, and 5D are illustrations of a chip alignment process including four steps 500a, 500b, 500c, and 500d (collectively 500) for connecting two chips 502a and 502b (collectively 502) with conductive pads 504a and 504b (collectively 504). The chips 502a and 502b may each be VLSI chips; one may be a semiconductor chip and the other a bridge chip, or one may be a bridge chip and the other a wafer. Each of the chips 502a and 502b include V-grooves 506a and 506b, respectively. The example alignment process includes placing a spherical ball 508 in the V-groove 506b of chip 502b. The ball 508 is compliant, such that the ball 508a is capable of being deformed due to pressure being applied thereto. In one embodiment, the ball 508a is formed of a polymer material, such as a plastic ball, that is hollow in its center so as to provide for more compliance than a solid polymer ball. Such a polymer ball is provided by Microspheres-Nanospheres located in Cold Spring, N.Y. The chips 502 are shown to be vertically separated and horizontally misaligned from one another in step 500a during the alignment process 500.

As shown in step 500b, the V-groove 506a of chip 502a is lowered onto the ball 508. As the chip 502a continues to lower, chip 502a self-aligns with chip 502b. As shown at step 500c, after chip 502a self-aligns with chip 502b, pressure may be applied to chip 502a, thereby causing the ball 508 to compress vertically until conductive pads 504a and 504b contact one another. As a result of the ball 508 vertically compressing, the alignment between the chips 502 may be maintained. The use of the compliant ball 508 may aid in maintaining the chips 502a and 502b in contact with one another.

At step 500d, the conductive pads 504a and 504b may be bonded together after contacting one another. The bonding process may include heating the chips 502 to a temperature upwards of 200 C to 300 C. Such temperatures substantially destroy or otherwise evaporate the compliant balls, thus substantially eliminating the possibility of creating micro-cracks in the chips as a result of vibration, which can occur with the use of non-compliant balls.

Figure 6A:
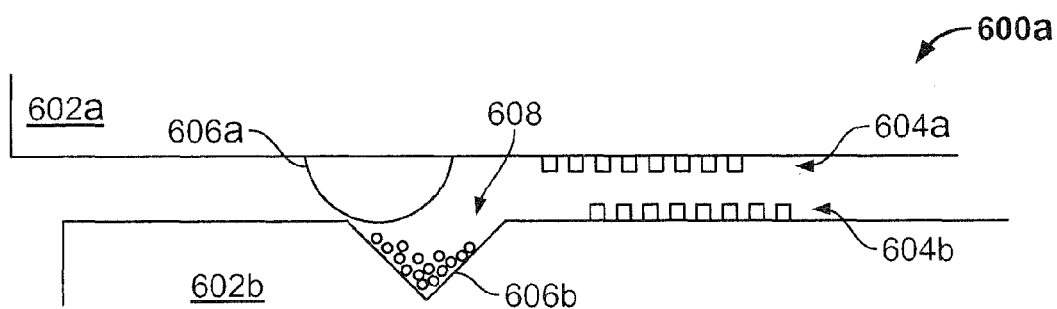
FIGS. 6A and 6B include illustrations of an alternative chip self-alignment process including two steps for connecting two chips with conductive pads.
Figure 6B:
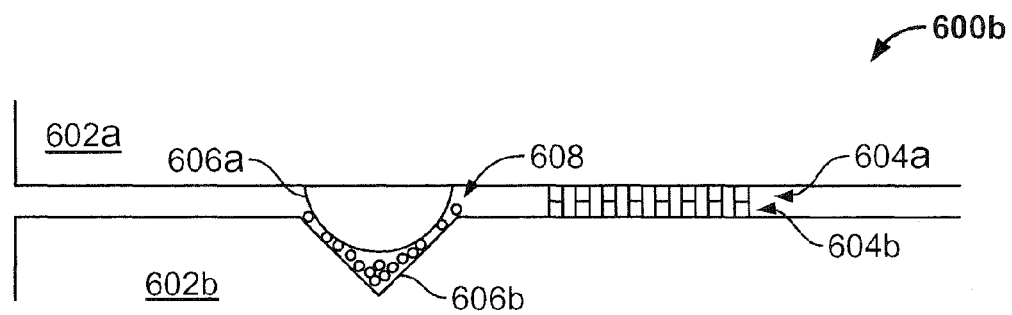

FIGS. 6A and 6B are illustrations of an alternative chip self-alignment process including two steps 600a and 600b for connecting two chips 602a and 602b (collectively 602) with conductive pads 604a and 604b (collectively 604). The chips 602a and 602b may each be VLSI chips, one may be a semiconductor chip and the other a bridge chip, or one may be a bridge chip and the other a wafer. Chip 602a includes a first self-alignment feature, shown here as a metallic hemispherical ball 606a, and chip 602b includes a second self-alignment feature, shown as a V-groove 606b. The metallic hemispherical ball 606a is formed using a semiconductor manufacturing process, such as one that forms ball grid arrays, as understood in the art. The use of metallic hemispherical balls may be less expensive and more accurate than alternative configurations.

Small compliant balls 608 are placed within the V-groove 606b. In one embodiment, the compliant balls 608 may be 1 micron or smaller. As shown, a sufficient number of compliant balls 608 are placed within the V-groove 606b so that the hemispherical ball 606a slides down the side of the V-groove 606b without stiction that can develop without the use the compliant balls 608. The compliant balls 608 effectively operate as ball bearings. The compliant balls 608 may be small enough so that self-alignment accuracy is not materially affected (i.e., the conductive pads 604a and 604b align and contact one another during the alignment process). The compliant balls 608 may be formed of a polymer material, which may be substantially destroyed or evaporated during a bonding process for bonding the conductive pads 604a and 604b.

The alignment process starts at step 600a, where the first chip 602a is placed on the second chip 602b, such that the metallic hemispherical ball 606a is placed next to the V-groove 606b. As the chip 602a is slid such that the metallic hemispherical ball 606a slides into the V-groove 606b, gravity provides for self-alignment of the two self-alignment features, while the compliant balls 608 operate to minimize or prevent stiction as the metallic hemispherical ball 606a slides into the V-groove 606b. The compliant balls 608 may remain within the V-groove 606b or some of the compliant balls 608 may be pushed out of the V-groove 606b. At step 600c, the conductive pads 604a and 604b are bonded together using heat, where the heat causes the compliant balls 608 to evaporate, which leaves a slight gap between the metallic hemispherical ball 606a and V-groove 606b. Once evaporated, the bonded conductive pads 606 hold the chips 602 together.

Figure 7:
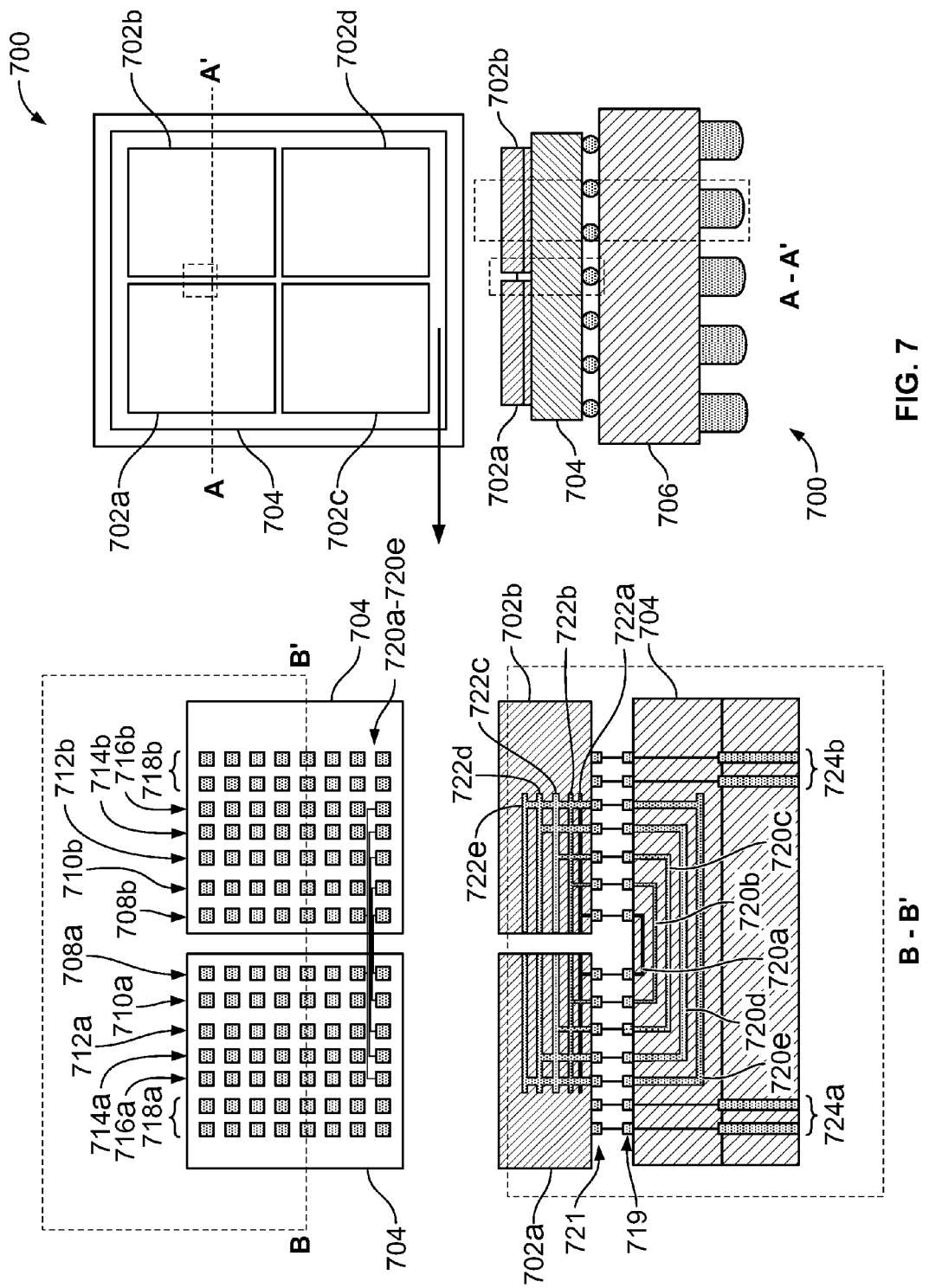
FIG. 7 is an illustration of an illustrative electronic circuit with respective metal layers on laterally adjacent chips being directly connected via a bridge.

FIG. 7 is an illustration of an illustrative electronic circuit 700 with respective metal layers on laterally adjacent chips being directly connected via a bridge. The electronic circuit 700 includes four chips 702a-702d (collectively 702). As described herein, the chips 702 may be VLSI chips, memory chips, I/O chips, or any other chips that are capable of being connected using a bridge chip or base wafer 704. A substrate 706 is used to support the base wafer 704 and chips 702. Conductive pads 708a-718a are shown to be on a portion of base wafer 704 that resides below chip 702a, and conductive pads 708b-718b (collectively matrix of conductive pads 708-718) are shown to be on a portion of base wafer 704 that resides below chip 702b. The columns of the matrix of conductive pads 708-718 are used to connect to different metal layers in chips 702a and 702b. A portion of conductive pads 719 that are positioned on base wafer 704 connect to trace lines 720a-720e as shown with metal layers 722a-722e, which are positioned on different metal layers in the base wafer 704. As shown, there are five metal layers in the base wafer 704. A portion of conductive pads 721 connect with trace lines 722a-722e in different metal layers in chips 702a and 702b. Power lines 724a and 724b extend vertically through the base wafer 704 to deliver power to electronic components formed on the chips 702a and 702b. Via holes may be utilized to connect the conductive pads 721 to different metal layers in the chips 702a and 702b. As shown, an electronic circuit with respective metal layers on laterally adjacent chips 702a and 702b are directly connected to one another via a bridge, which, in this case, is the base wafer 704. It should be understood that bridge chips may alternatively be utilized in accordance with the principles of the present invention. Although shown as five metal layers, it should be understood that more or fewer metal layers may be connected between adjacent chips in the same or similar manner as shown. It should also be understood that non-adjacent chips may be connected in the same or similar manner. Although not shown, the chips 702 and base wafer 704 may utilize the indirect self-alignment techniques described herein. Because the pitch between the conductive pads may be sub-micron, lengths of the trace lines 720 may be 20 microns or less and have very low capacitance (e.g., 5-10 fF/trace line and conductive pads), so that communications between the metal layers may operate as if on the same chip.

The principles of the present invention provide for designing very large electronic circuits that are seamlessly integrated at very low costs. For example, rather than making a large FPGA (e.g., 10 cm$^2$), small FPGAs (e.g., 1 cm$^2$) may be tiled utilizing the principles of the present invention. By tiling the smaller FPGAs, an array of 10×10 FPGA chips may be created. Each of the FPGAs may include individual I/O chips. Chips other than FPGAs, such as phase-locked loop (PLLs) circuits, RF circuits etc., may be part of the large integrated tiled circuit. The use of the seamless tiling as described herein provides for FPGAs to be same size in gate numbers as application specific integrated circuits (ASICs). Being capable of creating an FPGA circuit through the tiling process as described herein is significant in that FPGAs today are limited to having less than 1/10th gate numbers of ASICs at any cost. Through the use of the principles of the present invention, FPGAs may be manufactured that have a higher gate count than ASICs. In addition, the principles of the present invention provide for building an array of microprocessors and DSPs by tiling with buses and memories, as described with regard to FIG. 1. Furthermore, integrated circuits that include flash chips, RF chips, DRAMs, and processors may be formed, where each of the chips communicate with one another as if on a single chip, which is currently not possible. Still yet, MEMs may be integrated with VLSI functions utilizing the chip tiling configurations, as described herein.

The previous detailed description of a small number of embodiments for implementing the invention is not intended to be limiting in scope. One of skill in this art will immediately envisage the methods and variations used to implement this invention in other areas than those described in detail.

I claim:

1. An electronic circuit, comprising:
    a first chip including first electronics and a first connector including a plurality of self-alignment features and conductive pads;
    a second chip including second electronics and a second connector including a plurality of self-alignment features and conductive pads, said first chip and second chip being indirectly horizontally aligned with one another and in electrical communication with one another via the first and second connectors; and
    a third chip including (i) a third connector including a plurality of self-alignment features and conductive pads that align with the conductive pads of the first connector and (ii) a fourth connector including a plurality of self-alignment features and conductive pads that align with the conductive pads of the second connector,
    wherein the conductive pads of the first and third connectors touch one another and the conductive pads of the second and fourth connectors touch one another upon completion of a self-alignment process that includes the self-alignment features of the connectors self-aligning.

2. The electronic circuit according to claim 1, further comprising:
    a first set of balls sized to enable the self-alignment features of the first and third connectors to self-align with the first set of balls being placed therebetween; and
    a second set of balls sized to enable the self-alignment features of the second and fourth connectors to self-align with the second set of balls placed therebetween.

3. The electronic circuit according to claim 2, wherein the conductive pads of the first and third connectors are fused to one another, and the conductive pads of the second and fourth connectors are fused to one another, and wherein said first and second sets of balls evaporate when the conductive pads are fused to one another.

4. The electronic circuit according to claim 1, further comprising a wafer including:
    a first set of self-alignment features that align with the self-alignment features of said first chip and a plurality of conductive pads associated with the first set of self-alignment features that align with the conductive pads of said first chip when the first set of self-alignment features are aligned with the self-alignment features of said first chip, and
    a second set of self-alignment features that align with the self-alignment features of said second chip and a plurality of conductive pads associated with the second set of self-alignment features that align with the conductive pads of said second chip when the second set of self-alignment features are aligned with the self-alignment features of said second chip.

5. The electronic circuit according to claim 4, wherein said wafer further includes transmission lines that extend between the conductive pads, thereby enabling electrical signals to pass between said first and second chips.

6. The electronic circuit according to claim 4, further comprising:
   a first set of balls sized to enable the self-alignment features of the first chip and first set of self-alignment features of said wafer to self-align with the first set of balls placed therebetween; and
   a second set of balls sized to enable the self-alignment features of the second chip and second set of self-alignment features of said wafer to self-align with the second set of balls placed therebetween.

7. The electronic circuit according to claim 6, wherein the conductive pads of the first connector and conductive pads associated with the first set of self-alignment features of said wafer are fused to one another, and the conductive pads of the second connector and conductive pads associated with the second set of self-alignment features of said wafer are fused to one another, and wherein said first and second sets of balls evaporate when the conductive pads are fused to one another.

8. The electronic circuit according to claim 1, wherein the third chip further comprises third electronics, said third chip, first chip, and second chip being coplanar and in electrical communication with one another via the first, second, and third connectors, and wherein said third chip is an input/output chip configured to enable communication from the electronic circuit with another electronic circuit.

9. A method of manufacturing an electronic circuit, comprising:
   providing a first chip including first electronics and a first connector including a plurality of self-alignment features and conductive pads;
   providing a second chip including second electronics and a second connector including a plurality of self-alignment features and conductive pads;
   causing the first chip and second chip to self-align via the respective self-alignment features, the first and second chips being indirectly horizontally aligned with one another;
   electrically connecting the first and second chips via the first and second connectors;
   providing a third chip including (i) a third connector including a plurality of self-alignment features and conductive pads that align with the conductive pads of the first connector and (ii) a fourth connector including a plurality of self-alignment features and conductive pads that align with the conductive pads of the second connector to the first and second chips via the respective first and second connectors; and
   connecting the third chip to the first and second chips such that the third chip is vertically positioned with respect to a portion of both the first and second chips,
   wherein connecting the third chip to the first and second chips comprises:
      causing the first and third connectors to self-align with one another;
      causing the second and fourth connectors to self-align with one another; and
      wherein, after causing the respective connectors to self-align, (i) the conductive pads of the first and third connectors touch one another and (ii) the conductive pads of the second and fourth connectors touch one another.

10. The method according to claim 9, further comprising:
placing a first set of balls between the first and third connectors prior to causing the first and third connectors to self-align; and
placing a second set of balls between the second and fourth connectors prior to causing the second and fourth connectors to self-align.

11. The method according to claim 10, further comprising:
fusing the conductive pads of the first and third connectors to one another; and
fusing the conductive pads of the second and fourth connectors to one another, wherein said first and second sets of balls evaporate when the conducive pads are fused to one another.

12. The method according to claim 9, further comprising:
providing a wafer including:
   a first set of self-alignment features that align with the self-alignment features of said first chip and a plurality of conductive pads associated with the first set of self-alignment features that align with the conductive pads of said first chip when the first set of self-alignment features are aligned with the self-alignment features of said first chip;
   a second set of self-alignment features that align with the self-alignment features of said second chip and a plurality of conductive pads associated with the second set of self-alignment features that align with the conductive pads of said second chip when the second set of self-alignment features are aligned with the self-alignment features of said second chip;
connecting the first chip to the wafer via the first connector and conductive pads associated with the first set of alignment features; and
connecting the second chip to the wafer via the second connector and conductive pads associated with the second set of alignment features.

13. The method according to claim 12, further comprising:
providing a wafer with electrical connections between third and fourth connectors disposed on the wafer;
causing the first and third connectors to self-align to connect the first chip to the wafer; and
causing the second and fourth connectors to self-align to connect the second chip to the wafer, the first and second chips thereby being electrically connected to one another.

14. The method according to claim 12, further comprising:
placing a first set of balls between the self-alignment features of the first chip and first set of self-alignment features of the wafer; and
placing a second set of balls between the self-alignment features of the second chip and second set of self-alignment features of the wafer.

15. The method according to claim 14, further comprising:
fusing the conductive pads of the first connector and conductive pads associated with the first set of self-alignment features of the wafer; and
fusing the conductive pads of the second connector and conductive pads associated with the second set of self-alignment features of the wafer, and wherein the first and second sets of balls evaporate during the fusing processes.

16. The method according to claim 9,
wherein the first, second, and third chips are positioned in a coplanar configuration, wherein the method further comprises:
electrically connecting the first, second chip via the first, second, and third connectors, and wherein the third chip is an input/output chip configured to enable communication between the first or second chip with another electronic circuit.

* * * * *